(12) United States Patent
Lee et al.

(10) Patent No.: US 6,326,270 B1
(45) Date of Patent: Dec. 4, 2001

(54) METHODS OF FORMING INTEGRATED CIRCUIT MEMORY DEVICES USING MASKING LAYERS TO INHIBIT OVERETCHING OF IMPURITY REGIONS AND CONDUCTIVE LINES

(75) Inventors: Kang-Yoon Lee; Woo-Tag Kang; Jeong-Seok Kim; Yoo-Cheol Shin, all of Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/419,836

(22) Filed: Oct. 15, 1999

(30) Foreign Application Priority Data

Oct. 16, 1998 (KR) .................................. 98-43765
Dec. 4, 1998 (KR) .................................. 98-53173

(51) Int. Cl.[7] .................................. H01L 21/336
(52) U.S. Cl. .................. 438/279; 438/301; 438/303; 438/587; 438/595; 438/696; 438/740
(58) Field of Search .................................. 438/266, 279, 438/200, 230, 301, 303, 585, 587, 595, 639, 689, 696, 701, 713, 723, 724, 740, 749, 751

(56) References Cited

U.S. PATENT DOCUMENTS 5,219,793 * 6/1993 Cooper et al. .................. 438/624
5,882,973 * 3/1999 Gardner et al. .................. 438/279
5,935,875 * 8/1999 Lee .................................. 438/737
6,030,876 * 2/2000 Koike .................................. 438/303

* cited by examiner

*Primary Examiner*—Charles Bowers
*Assistant Examiner*—Asok Kumar Sarkar
(74) *Attorney, Agent, or Firm*—Myers Bigel Sibley & Sajovec

(57) ABSTRACT

Methods of forming integrated circuit memory devices may include steps to form memory cell access transistors therein. These steps may include steps to form a gate line on a semiconductor substrate and then implant dopants of first conductivity type into the semiconductor substrate to define a self-aligned impurity region therein. A spacer layer of a first material is then formed on a sidewall and upper surface of the gate line. An interlayer insulating layer of a second material is then formed on the spacer layer. A series of selective etching steps are then performed using different etchants. For example, a step is performed to selectively etch the interlayer insulating layer to define a contact hole therein, using the spacer layer as an etching mask to protect the gate line from etching damage. A selective etching step is then performed to convert the spacer layer into a sidewall spacer on the sidewall of the gate line. This etching step is performed using the interlayer insulating layer as an etching mask. A conductive plug (e.g., bit line plug) is then formed in the contact hole. This conductive plug forms an ohmic contact with the impurity region.

17 Claims, 16 Drawing Sheets

METHODS OF FORMING INTEGRATED CIRCUIT MEMORY DEVICES USING MASKING LAYERS TO INHIBIT OVERETCHING OF IMPURITY REGIONS AND CONDUCTIVE LINES

RELATED APPLICATION

This application is related to Korean Application Nos. 98-43765, filed Oct. 16, 1998 and 98-51373, filed Dec. 4, 1998, the disclosures of which are hereby incorporated herein by reference.

FIELD OF THE INVENTION

The present invention relates to methods of forming integrated circuit devices, and more particularly to methods of forming integrated circuit memory devices.

BACKGROUND OF THE INVENTION

To address the reductions in design ground rules that typically accompany state-of-the-art methods of forming highly integrated circuit devices (e.g., memory devices), self-alignment techniques have been developed to address limitations associated with conventional optical photolithography techniques. A conventional method of forming integrated circuit memory devices using self-alignment techniques is illustrated by FIGS. 1A–1C. In particular, FIG. 1A illustrates the steps of forming device isolation regions 2 (e.g., shallow trench isolation (STI) regions) in a semiconductor substrate 1 and then forming a gate oxide layer (not shown) on a face of the substrate 1. A plurality of gate lines 8 are then formed on the gate oxide layer. The gate lines 8 may be formed by depositing a polycrystalline silicon layer 4 on the gate oxide layer and then depositing a polycide layer 5 (e.g., $WSi_2$ or $TiSi_2$) on the polycrystalline silicon layer 4. A gate mask layer 6 (e.g., silicon nitride layer) is then formed on the polycide layer 5. Conventional photolithographically defined masking and etching steps are then performed to etch the plurality of layers and define a plurality of gate lines 8. Dopants are then implanted into the substrate 1 to define an impurity region 9a in the cell array region, and define a plurality of shallow source/drain regions 9b and 9c in the peripheral circuit region, using the gate lines 8 as an implant mask. Silicon nitride spacers 10 are then formed on sidewalls of the gate lines 8. N-type dopants are then selectively implanted into the peripheral circuit region to define self-aligned N-type source and drain regions 11a therein. Steps are also performed to selectively implant P-type dopants into the peripheral circuit region to define self-aligned P-type source and drain regions 11b therein. A first interlayer insulating layer 12 (e.g., oxide layer) may then be formed on the substrate 1, as illustrated, and then planarized using conventional chemical-mechanical polishing (CMP) or etch-back techniques.

Referring now to FIG. 1B, a self-aligned contact hole 14 is then formed in the first interlayer insulating 12, by etching the first interlayer insulating layer 12 to expose the impurity region 9a. During this etching step, an etchant is used that preferably etches the first interlayer insulating layer 12 at a high rate relative to the rate at which the spacers 10 and gate mask layer 6 are etched. A conductive plug 16 is then formed in the contact hole 14 using conventional techniques. Unfortunately, although the silicon nitride spacers 10 and gate mask layer 6 may act to prevent the formation of a short circuit between the polycide layer 5 and the conductive plug 16, the steps to form the contact hole 14 may cause the impurity region 9a to become overetched, as highlighted by region 17. The steps to define the silicon nitride spacers 10 may also result in some degree of overetching of the impurity region 9a. Such overetching may increase the resistance of the contact formed between the impurity region 9a and the conductive plug 16 and may reduce the reliability of memory devices formed in the cell array region (e.g., may increase refresh failure rate). To address these problems, plug ion implantation steps are typically performed to improve contact resistance and thin oxide layers may be formed on the impurity regions 9a to repair etching damage.

Referring now to FIG. 1C, a second interlayer insulating layer 20 is then deposited on the first interlayer insulating layer 12. Selected portions of the gate mask layer 6, the first interlayer insulating layer 12 and the second interlayer insulating layer 20 are then etched to define a plurality of contact holes 21a–21e. However, such etching steps may cause the polycide layer 5 and the source/drain regions 11a and 11b to become overetched if the contact holes are etched simultaneously, as illustrated by highlighted region 24. Etching the contact holes 21a–21e simultaneously may also be difficult since the formation of each contact hole may require a different material to be etched. For example, to define contact hole 21a, only the second interlayer insulating layer 20 needs to be etched, however, to define contact holes 21b and 21d, the first and second interlayer insulating layers must be etched in addition to the silicon nitride gate mask layer 6. These contact holes 21a–21e may then be filled with a conductive material (e.g., metal) to define a plurality of contacts 22a–22e.

To inhibit the occurrence of over-etching defects, a thin silicon nitride layer can be deposited on the substrate and gate lines 8 after the source and drain regions have been formed. However, if the silicon nitride layer has an uneven thickness (e.g., thicker on top of the gate lines 8 and thinner on the source and drain regions 11a and 11b), overetching of the source and drain regions may still occur because silicon typically does not have good etching selectivity relative to silicon nitride.

Another conventional method of forming integrated circuit memory devices using self-alignment techniques is illustrated by FIGS. 2A–2B. In particular, FIG. 2A illustrates the steps of forming device isolation regions 32 in a semiconductor substrate 30 and then forming a gate oxide layer (not shown) on a face of the substrate 30. A plurality of gate lines 38 are then formed on the gate oxide layer. The gate lines 38 may be formed by depositing a polycrystalline silicon layer 34 on the gate oxide layer and then depositing a polycide layer 35 (e.g., $WSi_2$ or $TiSi_2$) on the polycrystalline silicon layer 34. A gate mask layer 36 (e.g., silicon nitride layer) is then formed on the polycide layer 35. Conventional photolithographically defined masking and etching steps are then performed to etch the plurality of layers and define a plurality of gate lines 38. Dopants are then implanted into the substrate 30 to define an impurity region 39a, and a plurality of shallow source/drain regions 39b and 39c, using the gate lines 38 as an implant mask. To enhance the electrical characteristics of silicide contact layers 46 to be formed during subsequent process steps (by reducing substrate damage), a thin oxide layer 40 is then formed on the substrate 30 and on the sidewalls of the gate lines 38, as illustrated.

Next, silicon nitride spacers 42 are then formed on sidewalls of the gate lines 38 using conventional techniques. Steps are then performed to selectively implant N-type dopants into the peripheral circuit region to define self-aligned N-type source and drain regions 44 therein. Steps are also performed to selectively implant P-type dopants into the peripheral circuit region to define self-aligned P-type source and drain regions 45 therein. Highly conductive silicide contact layers 46 are then formed on the source and drain regions 44 and 45 using conventional techniques. A first interlayer insulating layer 48 (e.g., oxide layer) may then be formed on the substrate 30, as illustrated, and then planarized using conventional chemical-mechanical polishing (CMP) or etch-back techniques.

A self-aligned contact hole 49 is then formed in the first interlayer insulating 12, by etching the first interlayer insulating layer 48 to expose the impurity region 39a. During this etching step, an etchant is used that preferably etches the first interlayer insulating layer 48 at a high rate relative to the rate at which the spacers 42 and gate mask layer 36 are etched. However, during this etching step, the portions of the thin oxide layer 40 that extend between the gate lines 38 and the silicon nitride spacers 42 may become excessively etched, as illustrated by highlighted region 50. Such over etching may expose the polycide layers 35. Then, during formation of a conductive plug 52 in the contact hole 49, a parasitic short circuit may be formed between the conductive plug 52 and the polycide layer 35.

Referring now to FIG. 2B, a second interlayer insulating layer 54 is then formed on the first interlayer insulating layer 48. Contact holes 55a–55e are then formed and filled with contacts 56a–56e, as illustrated. Unfortunately, the formation of such contact holes may cause the silicide contact layers 46 to become overetched, as illustrated by highlighted region 58. Such overetching may reduce device reliability by, among other things, increasing contact resistance and junction damage.

Thus, notwithstanding the above-described methods illustrated by FIGS. 1A–1C and 2A–2B, there continues to be a need for improved methods of forming integrated circuit devices that increase reliability by reducing the likelihood of parasitic over-etching.

SUMMARY OF THE INVENTION

It is therefore an object of the present invention to provide improved methods of forming integrated circuit devices.

It is another object of the present invention to provide methods of forming integrated circuit devices that include steps to inhibit overetching of device regions therein.

These and other objects, advantages and features of the present invention can be provided by methods of forming field effect transistors that include the steps of forming a gate line on a semiconductor substrate and then implanting dopants of first conductivity type into the semiconductor substrate to define a self-aligned impurity region therein, using the gate line as an implant mask. A spacer layer of a first material is then formed on a sidewall and upper surface of the gate line. An interlayer insulating layer of a second material is then formed on the spacer layer. A series of selective etching steps are then performed using different etchants. For example, a step is performed to selectively etch the interlayer insulating layer to define a contact hole therein, using the spacer layer as an etching mask to protect the gate line from etching damage. A selective etching step is then performed to convert the spacer layer into a sidewall spacer on the sidewall of the gate line. This etching step is performed using the interlayer insulating layer as an etching mask. A conductive plug (e.g., bit line plug) is then formed in the contact hole. This conductive plug forms an ohmic contact with the impurity region.

The spacer layer can be used to provide additional protection to the gate line during the self-aligned etching steps, even if the gate line includes a protective masking/capping layer. Moreover, to inhibit substrate damage caused by dopant implanting steps, the step of forming a spacer layer and the implanting step may be preceded by the step of forming an oxide protection layer on a face of the semiconductor substrate and on the sidewall of the gate line. If the oxide protection layer is formed, the step of selectively etching the spacer layer may comprise selectively etching the spacer layer to expose the oxide protection layer. The oxide protection layer is then etched to expose the impurity region.

According to another embodiment of the present invention, a method of forming a field effect transistor may comprise the steps of forming a gate line on a semiconductor substrate and then implanting first dopants of first conductivity type into the semiconductor substrate to define shallow source/drain regions therein (e.g., LDD regions), using the gate line as an implant mask. Electrically insulating sidewall spacers are then formed on sidewalls of the gate line. Second dopants are then implanted into the semiconductor substrate to define deep source/drain regions therein. A protection layer of a first material is then formed on the deep source/drain regions. This protection layer is also formed on the sidewall spacers and on an upper surface of the gate line. Next, an interlayer insulating layer of a second material is formed on the protection layer. The interlayer insulating layer and the protection layer are then etched in sequence to expose the upper surface of the gate line. Both of these layers may be etched using a first etchant. Another etching step is then performed on the protection layer to expose the deep source/drain regions. This etching step is preferably performed using a second etchant that is different from the first etchant.

According to one preferred aspect of the present invention, the interlayer insulating layer comprises silicon oxide and the protection layer comprises silicon nitride. In this case, the first etchant is an etchant that etches silicon oxide more rapidly than silicon nitride and the second etchant is an etchant that etches silicon nitride more rapidly than silicon oxide. According to another preferred aspect of the present invention, the step of etching the interlayer insulating layer and the protection layer to expose the upper surface of the gate line is performed without exposing a portion of the protection layer on the deep source/drain regions. This can reduce the likelihood that the source and drain regions underlying the protection layer will be overetched.

According to still another embodiment of the present invention, methods of forming field effect transistors include the steps of forming a gate line on a semiconductor substrate having cell and peripheral regions therein and then implanting dopants of first conductivity type into the semiconductor substrate to define a first self-aligned impurity region therein, using the gate line as an implant mask. A spacer layer of a first material is then formed on a sidewall and upper surface of the gate line. The spacer layer of a first material is etched back to form a sidewall spacer on the sidewall of the gate line in the peripheral region, exposing the second impurity region of the semiconductor substrate in the peripheral region. An interlayer insulating layer of a second material is then formed on at least the spacer layer. A series of selective etching steps are then performed using different etchants. For example, a step is performed to selectively etch the interlayer insulating layer to define a contact hole therein in the cell region, using the spacer layer as an etching mask to protect the gate line from etching damage. A selective etching step is then performed to convert the spacer layer into a sidewall spacer on the sidewall of the gate line in the cell region. This etching step is performed using the interlayer insulating layer as an etching mask. A conductive plug (e.g., bit line plug) is then formed in the contact hole. This conductive plug forms an ohmic contact with the impurity region.

The spacer layer can be used to provide additional protection to the gate line during the self-aligned etching steps, even if the gate line includes a protective masking/capping layer. Moreover, to inhibit substrate damage caused by dopant implanting steps, the step of forming a spacer layer and the implanting step may be preceded by the step of forming an oxide protection layer on a face of the semiconductor substrate and on the sidewall of the gate line. If the oxide protection layer is formed, the step of selectively etching the spacer layer may comprise selectively etching the spacer layer to expose the oxide protection layer. The oxide protection layer is then etched to expose the first impurity region.

The step of etching back the spacer layer to form a sidewall spacer on the sidewall of the gate line in the peripheral region can be followed by the step of forming silicide contact region on the second impurity region of the peripheral region.

Independent of the formation of the oxide protection layer, another nitride protection layer can be provided to protect the semiconductor substrate after formation of the sidewall spacer in the peripheral region. More particularly, the nitride protection layer can protect the underlying second impurity region (or silicide contact region) in the peripheral region in a subsequent etching process for metal contact (e.g., bit line contact) formation.

The method further comprises forming a second interlayer insulating layer on the interlayer insulating layer including the conductive contact plug. Metal contact (e.g., bit line contacts) are opened to expose the conductive contact plug in the cell region, the gate electrode of the gate line in the peripheral region and the second impurity region (or silicide contact region) in the peripheral region by etching. The metal contact to the conductive contact plug is firstly formed in the cell region and then the contacts to the gate electrode and the second impurity region (or silicide contact) are formed in the peripheral region.

Formation of contacts to the second impurity region (or silicide contact) and to the gate electrode includes etching the interlayer insulating layers and the nitride protection layer. Both of these layers may be etched using a first etchant. Another etching step is then performed on the protection layer to expose the deep source/drain regions. This etching step is preferably performed using a second etchant that is different from the first etchant.

According to yet another embodiment of the present invention, a method of forming a semiconductor device may comprise the steps of forming a gate line on a semiconductor substrate including cell and peripheral regions. The gate line comprises a composite of a polysilicon layer, a polycide layer on the polysilicon layer, a silicon nitride capping layer on the polycide layer and a silicon oxide capping layer on the silicon nitride capping layer. An oxide protection layer is formed on the semiconductor substrate including the gate line. A first impurity region is formed into the cell and peripheral regions of the semiconductor substrate, using the gate line as an implant mask. A nitride spacer layer is formed at least on a sidewall and upper surface of the gate line. The spacer layer is selectively etched to form a nitride sidewall spacer on the sidewall of the gate line in the peripheral region and then forming a second impurity region into the peripheral region, using the sidewall spacer as an implant mask. A silicide contact is formed on the second impurity region in the peripheral region. A nitride protection layer is formed on an entire surface of the semiconductor substrate. A first interlayer insulating layer is formed on the nitride protection layer. The first interlayer insulating layer is selectively etched to define a contact hole therein, using the nitride protection layer and nitride spacer layer as an etching stopper in the cell region. The nitride protection layer and nitride sidewall spacer are selectively etched to form a nitride sidewall spacer on the sidewall of the gate line in the cell region, using the first interlayer insulating layer as an etching mask. A conductive plug is formed to be electrically connected to the first impurity region, in the contact hole in the cell region. A second interlayer insulating layer is formed on the first interlayer insulating layer including the conductive plug. Contacts are formed to the conductive plug in the cell region and to the polycide layer of the gate line in the peripheral and to the silicide contact of the semiconductor substrate in the peripheral region.

DESCRIPTION OF PREFERRED EMBODIMENTS

Figure 1A:
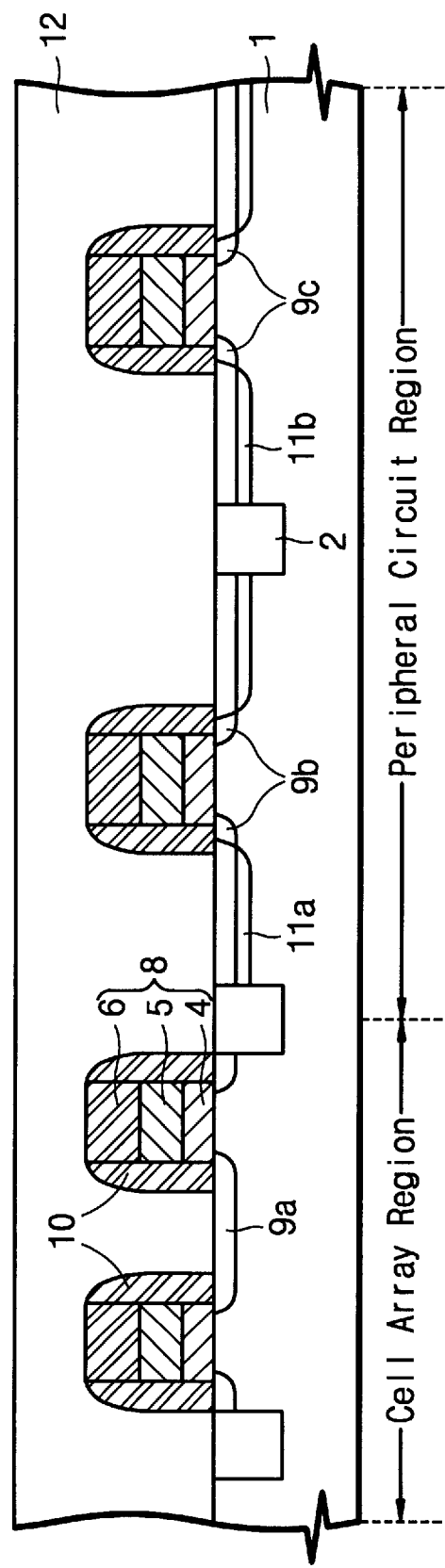
FIGS. 1A–1C are cross-sectional views of intermediate structures that illustrate a method of forming an integrated circuit memory device according to the prior art.
Figure 1B:
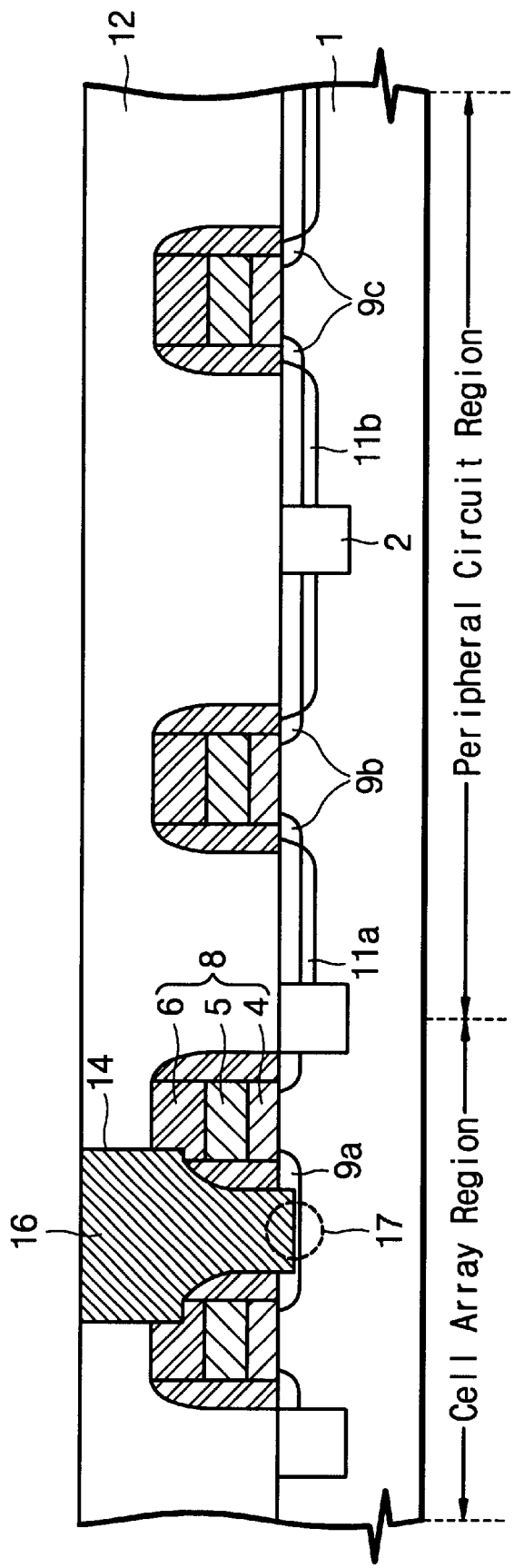
Figure 1C:
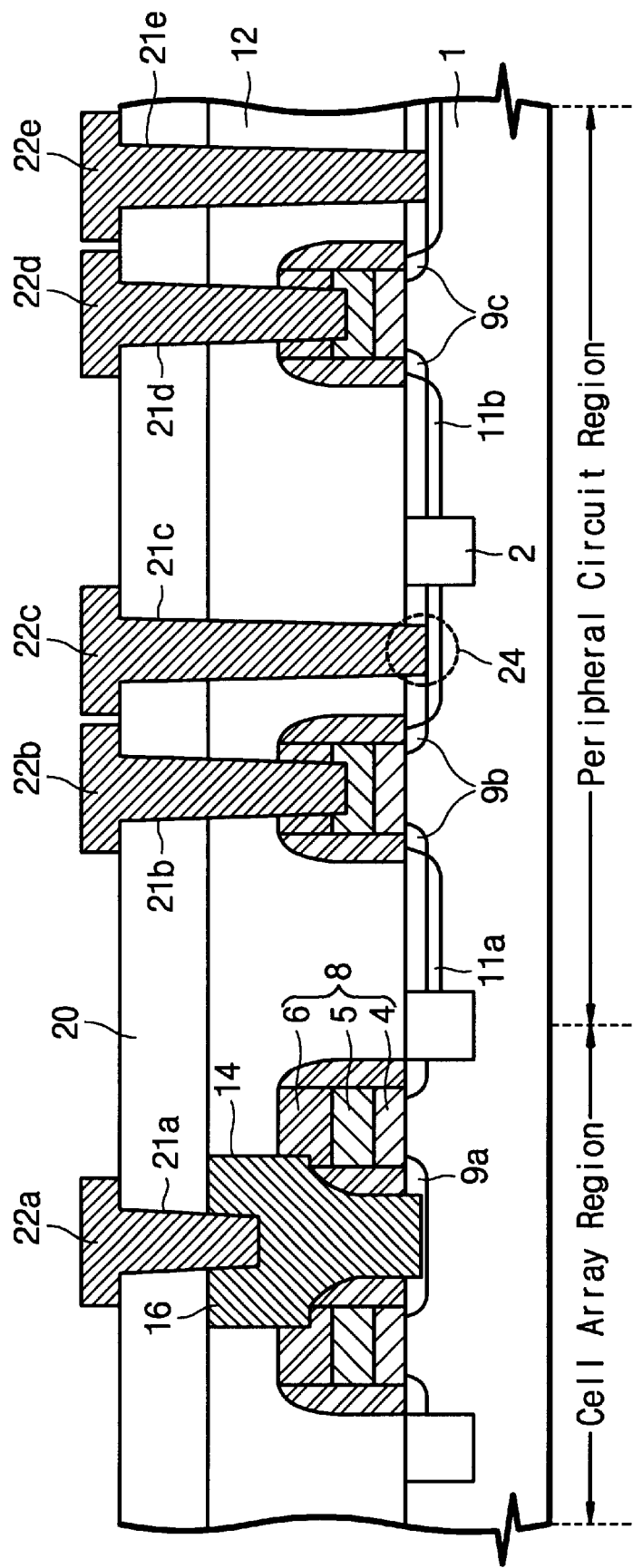
Figure 2A:
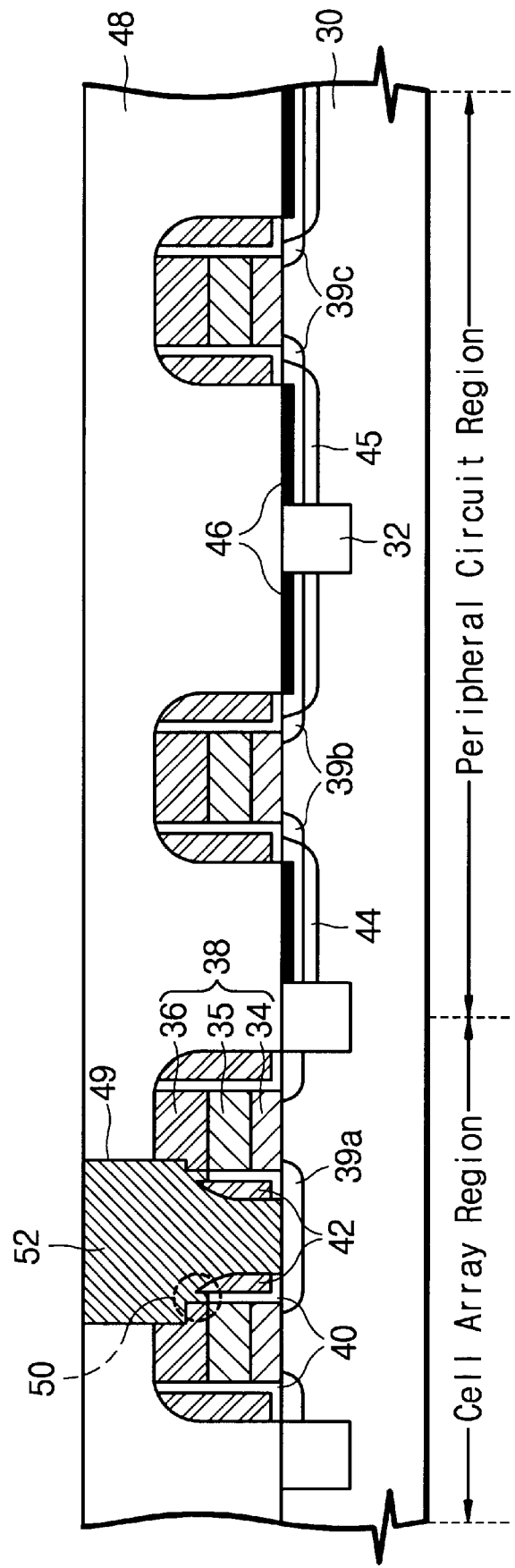
FIGS. 2A–2B are cross-sectional views of intermediate structures that illustrate another method of forming an integrated circuit memory device according to the prior art.
Figure 2B:
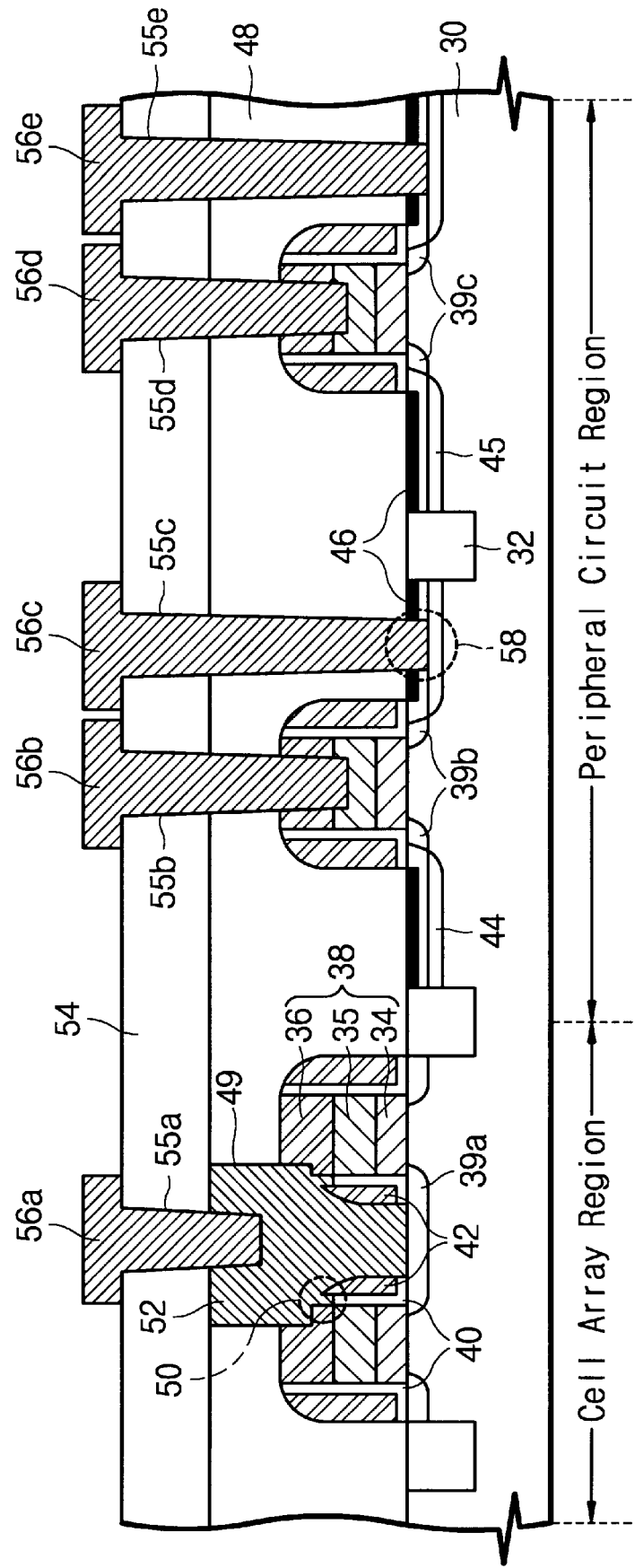

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. However, when a layer or region is described as being "directly on" another layer or region, no intervening layers or regions are present. Like numbers refer to like elements throughout. Moreover, the terms "first conductivity type" and "second conductivity type" refer to opposite conductivity type such as P or N-type, however, each embodiment described and illustrated herein includes its complementary embodiment as well.

Figure 3A:
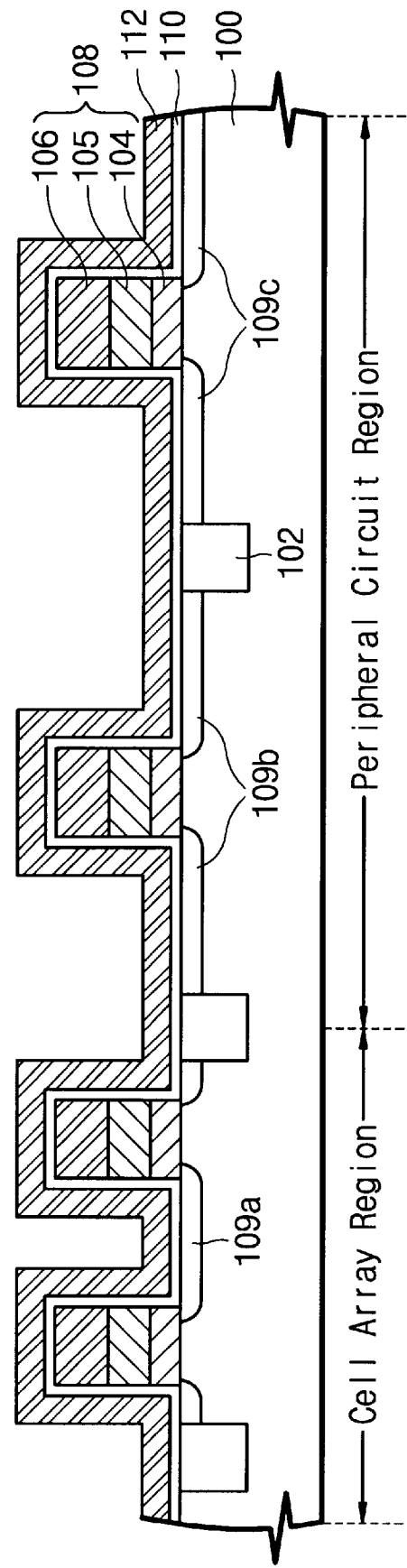
FIGS. 3A–3G are cross-sectional views of intermediate structures that illustrate methods of forming integrated circuit memory devices according to a first embodiment of the present invention.

Referring now to FIGS. 3A–3G, preferred methods of forming transistors in an integrated circuit substrate containing memory cell array and peripheral circuit regions therein will be described. These transistors may comprise access transistors of DRAM memory cells or the NMOS and PMOS transistors of peripheral circuits used to control and drive the memory cells within the cell array. In particular, FIG. 3A illustrates the steps of forming a plurality of device isolation regions 102 in a semiconductor substrate 100 having doped well regions of predetermined conductivity type (not shown) therein. As will be understood by those skilled in the art, the device isolation regions 102 may be formed using conventional shallow trench isolation (STI) techniques, however, other techniques for forming isolation regions may also be used. Next, a gate oxide layer (not shown) is formed on a face of the substrate 100, The gate oxide layer may have a thickness in a range between about 10 Å and 100Å, for example.

A gate electrode layer and gate mask layer 106 are then formed on the gate oxide layer. The gate electrode layer and gate mask layer may then be patterned using conventional photolithographically defined etching techniques to define a plurality of gate lines 108. As illustrated, the gate electrode layer may comprise a composite of an underlying polysilicon layer 104 and a highly conductive layer 105 on the polysilicon layer. The composite gate electrode layer may have a thickness in a range between about 500 Å and 3000 Å, for example. The highly conductive layer 105 is provided to reduce the resistance of the gate lines 108. Accordingly, the highly conductive layer 105 may comprise a polysilicide layer selected from the group consisting of TiSix, WSix, NiSix and CoSix and/or a metal layer selected from the group consisting of TiN, W, WN and Al. The gate mask layer 106 is preferably formed as a silicon nitride layer so that highly selective etching steps can be performed during subsequent process steps, however, the gate mask layer 106 may also comprise an oxide, as described more fully hereinbelow with respect to FIGS. 5–7. The gate mask layer 106 may have a thickness in a range between about 500 Å and 2000 Å, for example.

A relatively low dose dopant implantation step may then be performed to define a junction region 109a of first conductivity type (e.g., N-type) in the cell array region and also define a plurality of lightly doped source and drain regions 109b and 109c in the peripheral circuit region. A relatively thin oxide layer 110 is then formed on the substrate 100 and gate lines 108, as illustrated. The thin oxide layer 110 may be formed to a thickness of between about 50 Å and 200 Å. This thin oxide layer 110 may comprise a middle temperature oxide (MTO), a high temperature oxide (HTO), a high density plasma (HDP) oxide layer, a tetraethyl-ortho-silicate (TEOS) layer, a borophosphosilicate glass (BPSG) layer, an undoped silicate glass (USG) layer and/or a thermal oxide layer, for example. To inhibit dopant implant damage to the substrate 100, the thin oxide layer 110 may be formed prior to the low dose dopant implant step.

Referring still to FIG. 3A, a preferred spacer insulating layer 112 is then formed as a blanket layer on the thin oxide layer 110 and gate lines 108, as illustrated. The spacer insulating layer 112 may comprise silicon nitride (e.g., $Si_3N_4$, SiON) and may have a thickness in a range between about 20 Å and 200 Å, and more preferably in range between about 30 Å and 100 Å.

Figure 3B:
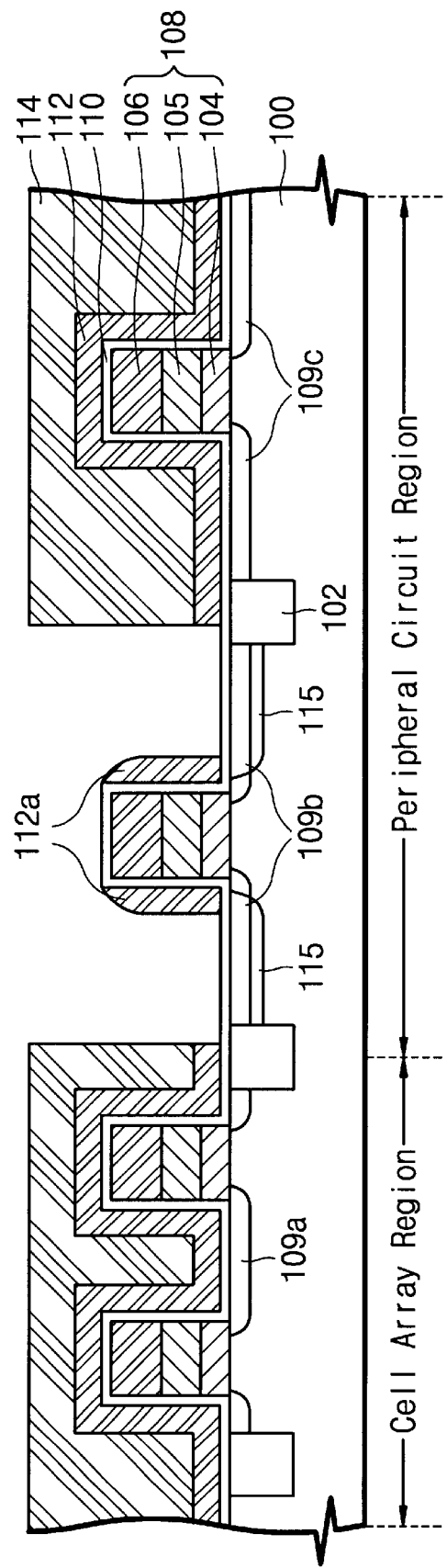

Referring now to FIG. 3B, a first photoresist layer 114 is then deposited on the spacer insulating layer 112. This first photoresist layer 114 is then patterned to expose a portion of the spacer insulating layer 112 extending opposite the peripheral circuit region. The exposed portion of the spacer insulating layer 112 is then selectively etched, using the patterned first photoresist layer 114 as an etching mask. This highly selective etching step results in the formation of gate spacers 112a for gates of NMOS transistors. During the etching step, portions of the thin oxide layer 110 are exposed, as illustrated. These portions of the thin oxide layer 110 act to suppress dopant implant damage to the substrate 100. Next, source and drain regions 115 of NMOS transistors are formed in the peripheral circuit region by implanting N-type dopants at a relatively high dose level into the substrate 100, using the patterned first photoresist layer 114 and gate spacers 112a as an implant mask. The patterned first photoresist layer 114 may also be removed prior to performing the implant step using the N-type dopants.

Figure 3C:
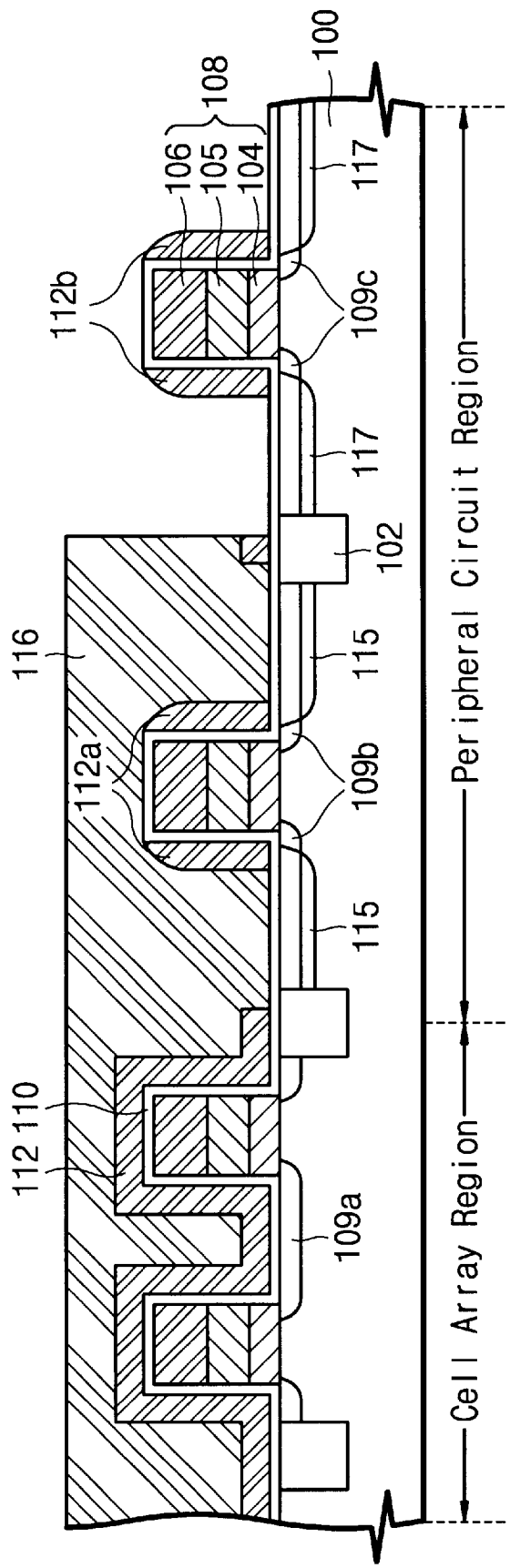

Referring now to FIG. 3C, similar steps to those described above with respect to FIG. 3B are performed to define a plurality of P-type source and drain regions of PMOS transistors in the peripheral circuit region. In particular, a second photoresist layer 116 may be patterned to expose the spacer insulating layer 112 and then the spacer insulating layer 112 may be selectively etched to define gate spacers 112b for the PMOS transistors. P-type dopants may then be implanted into the substrate 100 to define P-type source and drain regions 117 therein. As will be understood by those skilled in the art, the gate spacers 112a for the NMOS transistors and the gate spacers 112b for the PMOS transistors may also be formed at the same time using conventional photolithographically defined etching steps.

Figure 3D:
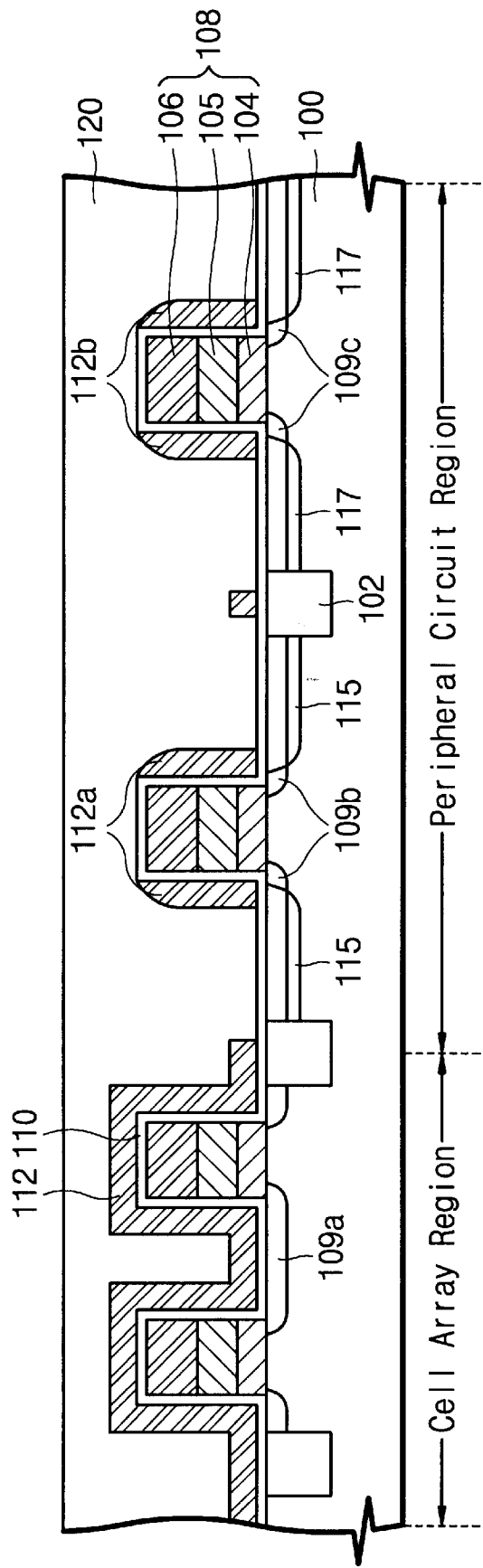

Referring now to FIG. 3D, the second photoresist layer 116 is removed and then an interlayer insulating layer 120 is deposited as a blanket layer on the substrate 100. This interlayer insulating layer 120 may be a BPSG, USG, HDP and/or TEOS layer, for example. A chemical-mechanical polishing (CMP) step or etch-back step may then be performed to planarize the interlayer insulating layer 120, as illustrated. Although not shown, the CMP or etch-back step may be performed until the upper surface of the spacer insulating layer 112 extending opposite the cell array region is exposed.

Figure 3E:
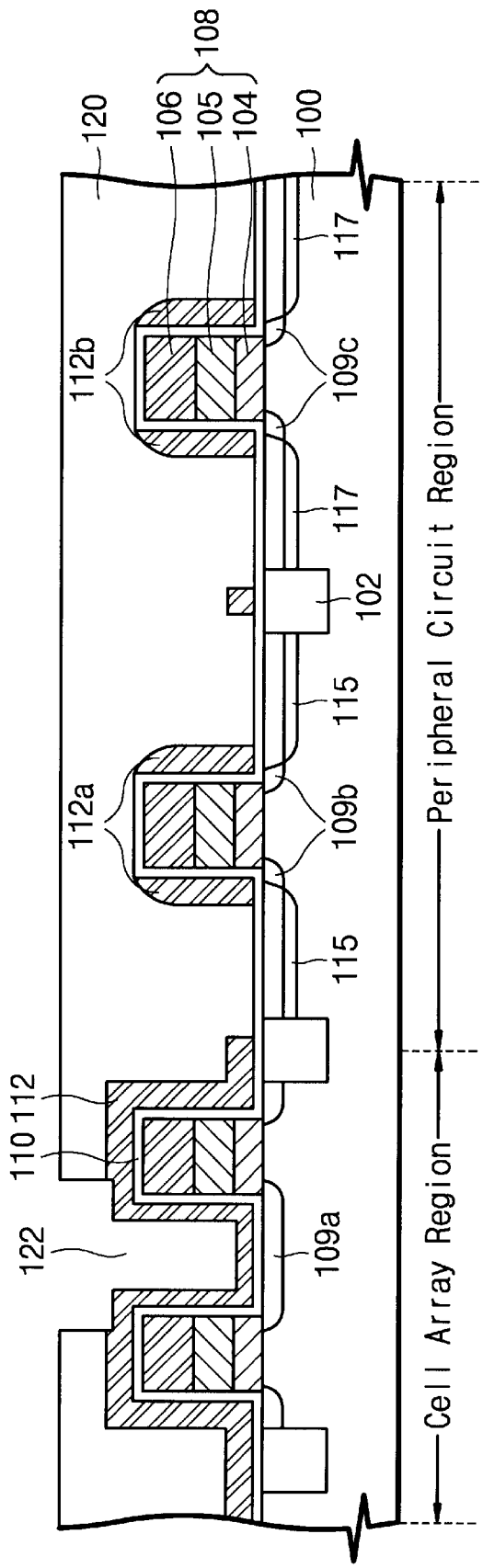
Figure 3F:
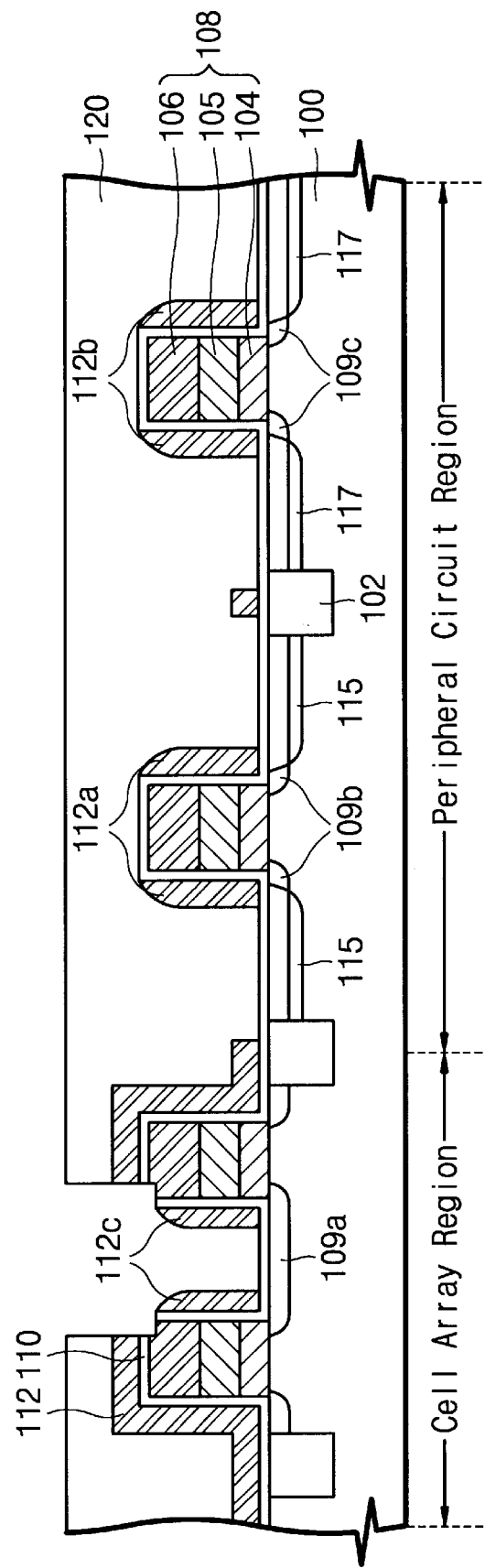

Referring now to FIG. 3E, an etching mask (not shown) is then deposited and photolithographically patterned to expose a portion of the interlayer insulating layer 120 extending opposite the junction region 109a. A highly selective etching step is then performed to etch the interlayer insulating layer 120 until the spacer insulating layer 112 comprising silicon nitride is exposed and a contact opening 122 is defined. According to a preferred aspect of the present invention, the remaining portion of the spacer insulating layer 112 extending opposite the cell array region can be used advantageously as an etch-stop layer during the step of forming a contact opening 122. Next, as illustrated best by FIG. 3F, the exposed portion of the spacer insulating layer 112 is then selectively etched to define additional gate spacers 112c. Here, because of the high degree of etching selectivity that can be achieved using preferred etchants, the interlayer insulating layer 120 and the thin oxide layer 110 can act as an etching mask and are not thinned substantially when the gate spacers 112c are formed.

Figure 3G:
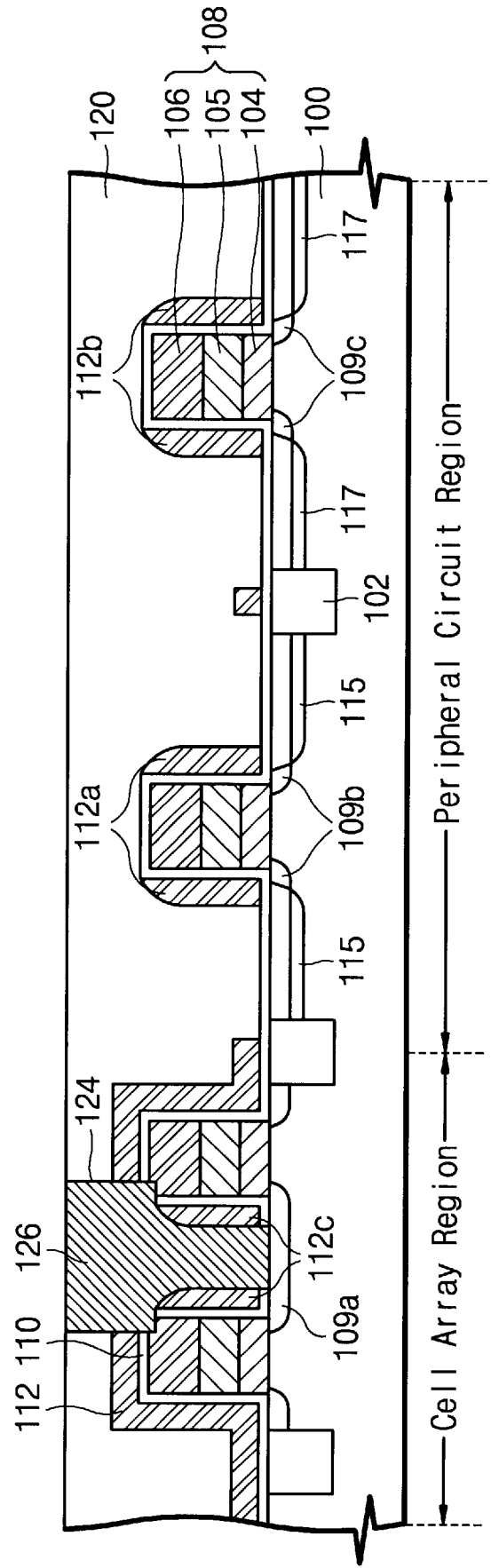
Figure 5:
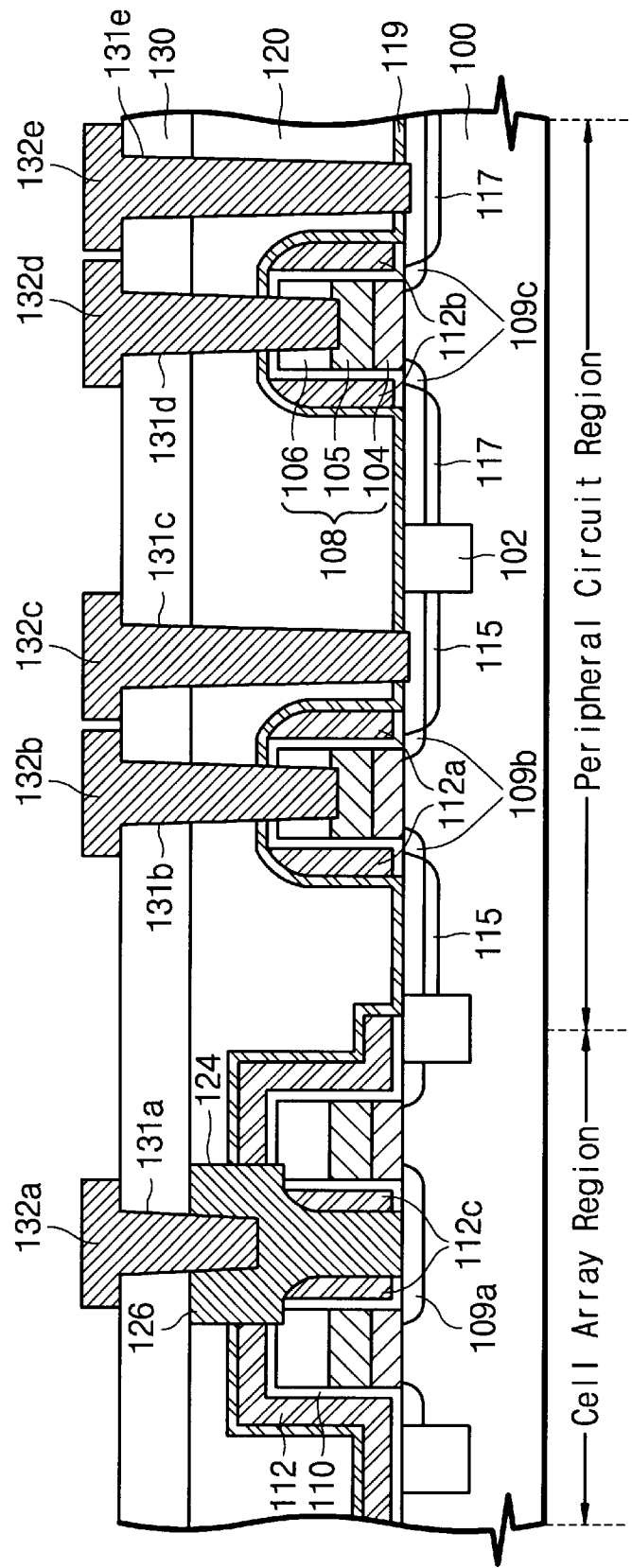
FIG. 5 is a cross-sectional view of an intermediate structure which when combined with the views of FIGS. 3A–3G illustrates methods of forming integrated circuit memory devices according to a third embodiment of the present invention.
Figure 6:
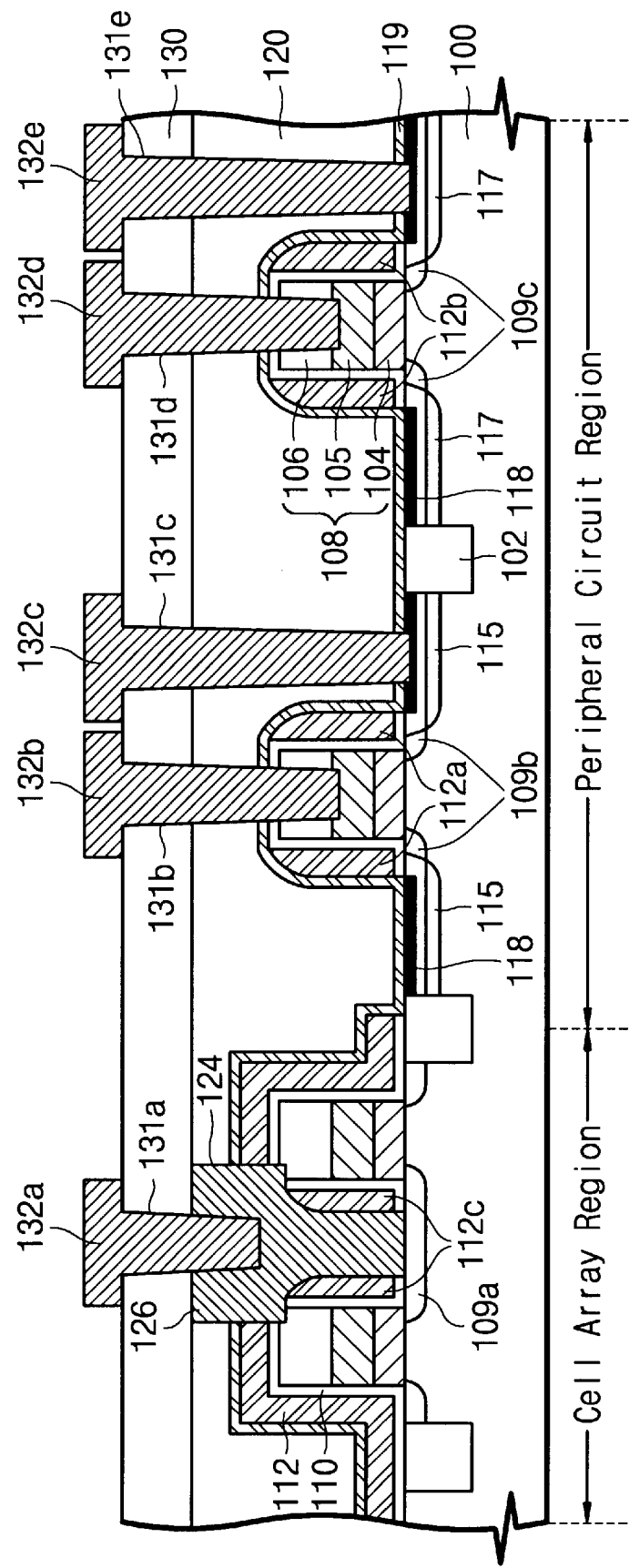
FIG. 6 is a cross-sectional view of an intermediate structure which when combined with the views of FIGS. 3A–3G illustrates methods of forming integrated circuit memory devices according to a fourth embodiment of the present invention.
Figure 7:
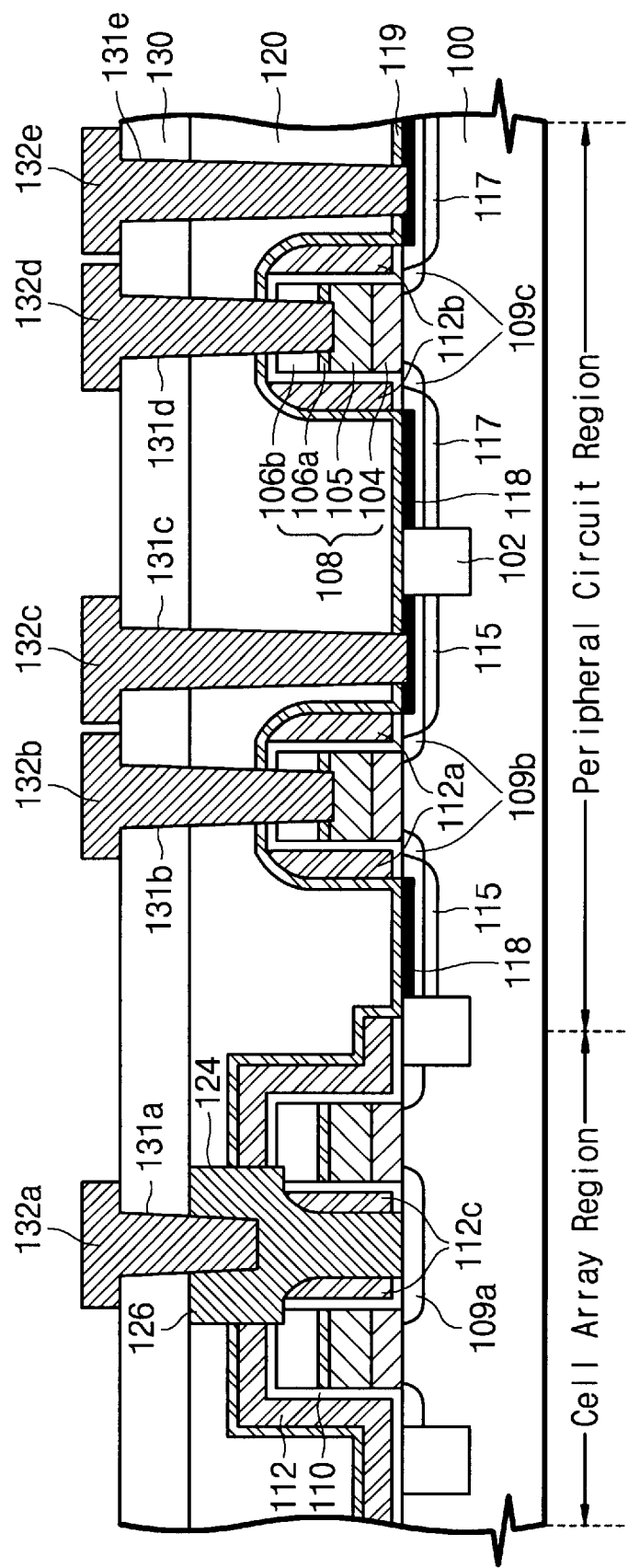
FIG. 7 is a cross-sectional view of an intermediate structure which when combined with the views of FIGS. 3A–3G illustrates methods of forming integrated circuit memory devices according to a fifth embodiment of the present invention.

Furthermore, as illustrated by FIG. 3G, the portion of the oxide layer 110 extending along the face of the substrate 100 and between the gate spacers 112c can then be removed using an anisotropic or isotropic etching step to form a self-aligned contact hole 124. This step of removing the portion of the oxide layer 110 extending between the gate spacers 112c can be performed without any substantial removal of the other portions of the oxide layer 110 extending between the spacer insulating layer 112 and the gate line 108 and between the gate spacers 112c and the gate line 108. Moreover, by using the above-described steps and retaining the spacer insulating layer 112 extending opposite the cell array region, the gate mask layer 106 need not be formed solely of a material such as silicon nitride, but may also be formed of an oxide without incurring the risk that the gate electrode layer will be exposed during formation of the contact hole 124, as illustrated by FIGS. 5–7. The contact hole 124 is then filled with a conductive plug 126 (e.g., polysilicon plug). This conductive plug 126 may provide an electrical connection between a bit line (not shown) and the impurity region 109a.

Figure 4:
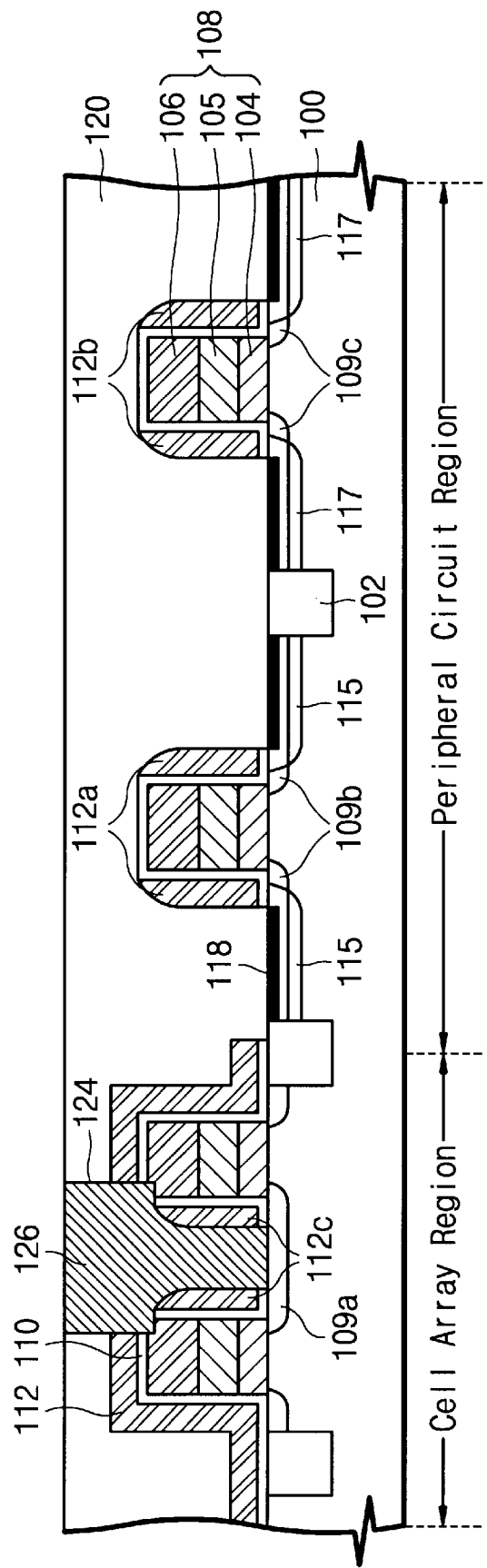
FIG. 4 is a cross-sectional view of an intermediate structure which when combined with the views of FIGS. 3A–3G illustrates methods of forming integrated circuit memory devices according to a second embodiment of the present invention.

Referring now to FIG. 4, the methods illustrated and described with respect to FIGS. 3A–3G may also include a step to form silicide contact regions 118. In particular, after the second photoresist layer 116 of FIG. 3C is removed, exposed portions of the thin oxide layer 110 extending between the gate spacers 112a and 112b are removed using conventional techniques to expose the highly doped source and drain regions 115 and 117. Conventional techniques can then be performed to define the silicide layers 118 on the highly doped source and drain regions 115 and 117. For example, a silicide forming metal such as Ti, Co or Ni may be deposited on the substrate 100 to a thickness in a range between about 30 Å and 200 Å and then a heat treatment step may be carried out to convert the deposited metal to metal silicide having a thickness in a range between about 50 Å and 1000 Å. Unreacted portions of the deposited metal may then be removed using conventional techniques (e.g., wet etching).

Referring now to FIG. 5, the methods illustrated and described with respect to FIGS. 3A–3G may also include a step to form a thin silicon nitride layer 119 that may have a thickness in a range between about 50 Å and 150 Å. For example, after the second photoresist layer 116 illustrated by FIG. 3C is removed, the exposed portions of the thin oxide layer 110 on the substrate 100 are also removed using conventional techniques. Then as illustrated by FIG. 5, a thin silicon nitride layer 119 is deposited as a blanket layer. This deposition step is then followed by the steps described above with respect to FIGS. 3D–3G. A second interlayer insulating layer 130 is then formed on the first interlayer insulating layer 120, as illustrated by FIG. 5.

This thin silicon nitride layer 119 serves as an etch stopping layer during the step of sequentially etching the second and first interlayer insulating layers 130 and 120 to define contact holes 131a–131e. The thin silicon nitride layer 119 is preferably used whenever the gate mask layer 106 is formed as an oxide layer instead of a silicon nitride layer. For example, assuming an etching selectivity of about 20:1 between oxide and silicon nitride when etching the interlayer insulating layer 120, a relatively thin silicon nitride layer may be used to prevent overetching of the source and drain regions 115 and 117 when contact holes 131c and 131e are being etched in the interlayer insulating layer 120. In particular, the thickness of the thin silicon nitride layer 119 is preferably selected so that the etching of contact holes 131b and 131d (to expose polycide regions 105) is complete before the source and drain regions 115 and 117 have been exposed (i.e., before the silicon nitride layer 119 on top of the source and drain regions 115 and 117 has been completely etched). This etching step is then followed by another etching step to complete contact holes 131c and 131e. During this latter etching step, an etchant can be used that etches silicon nitride faster than silicon oxide. The contact holes 131a–131e may be then filled with conductive contact plugs 132a–132e, as illustrated.

The steps described above with respect to FIGS. 4–5 can also be performed in combination to define the device of FIG. 6. Thus, the thin silicon nitride layer 119 can be used advantageously to protect the silicide layers 118. Moreover, if overetching of the highly conductive layer 105 within the gate lines 108 is a potential problem, a thin silicon nitride spacer layer 106a may be provided in combination with a thicker oxide layer 106b. This thin silicon nitride spacer layer 106a slows the rate of etching and reduces the likelihood that the conductive layer 105 will be overetched when the first interlayer insulating layer 120 is being etched to define contact holes 131c and 131e. Accordingly, as illustrated by FIGS. 5–7, the thicknesses of the thin silicon nitride layer 119 and the thin silicon nitride spacer layer 106a may be carefully controlled to prevent overetching of the silicide regions 118 and prevent overetching of the conductive layer 105 within the gate lines 108.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit memory device, comprising the steps of:

forming a gate line and a word line on a peripheral circuit portion and cell array portion of a semiconductor substrate, respectively;

forming a spacer layer on a sidewall and upper surface of the gate line and on a sidewall and upper surface of the word line;

selectively etching the spacer layer to define a first sidewall spacer on the sidewall of the gate line;

selectively implanting source and drain region dopants into the peripheral circuit portion of the semiconductor substrate, using the first sidewall spacer as an implant mask; then forming an interlayer insulating layer on the spacer layer;

selectively etching the interlayer insulating layer to define a contact hole therein, using the spacer layer as an etching mask;

selectively etching the spacer layer to define a second sidewall spacer on the sidewall of the word line, using the interlayer insulating layer as an etching mask; and forming a conductive bit line plug in the contact hole.

2. The method of claim 1, wherein the gate line comprises a conductive gate electrode and an electrically insulating gate masking layer on the conductive gate electrode; wherein the spacer layer and the gate masking layer comprise the same material; and wherein said step of selectively etching the spacer layer comprises etching the gate masking layer.

3. The method of claim 2, wherein the spacer layer and the gate masking layer comprise silicon nitride; and wherein the interlayer insulating layer comprises silicon dioxide.

4. The method of claim 3, wherein said step of forming a spacer layer is preceded by the step of forming an oxide protection layer on a face of the semiconductor substrate and on the sidewall of the gate line; and wherein said step of selectively etching the spacer layer comprises selectively etching the spacer layer to expose the oxide protection layer.

5. The method of claim 4, wherein said step of forming a spacer layer is preceded by the step of implanting dopants of first conductivity type into the semiconductor substrate to define an impurity region therein, using the gate line as an implant mask.

6. The method of claim 5, wherein said implanting step comprises implanting dopants of first conductivity type through the oxide protection layer.

7. A method of forming a semiconductor device, comprising the steps of:
   forming a gate line on a semiconductor substrate having cell and peripheral circuit regions therein;
   forming a first impurity region in the cell and peripheral circuit regions, using the gate line as an implant mask;
   forming a spacer layer on at least a sidewall and upper surface of the gate line;
   selectively etching the spacer layer to form a sidewall spacer on the sidewall of the gate line in the peripheral circuit region and then forming a second impurity region into the peripheral circuit region, using the sidewall spacer as an implant mask;
   forming an interlayer insulating layer on at least the spacer layer;
   selectively etching the interlayer insulating layer to define a contact hole therein, using the spacer layer as an etch-stop in the cell region; and
   selectively etching the spacer layer to form a sidewall spacer on the sidewall of the gate line in the cell region, using the interlayer insulating layer as an etching mask.

8. The method of claim 7, wherein the gate line comprises a conductive gate electrode and an electrically insulating gate masking layer on the conductive gate electrode; and wherein the gate masking layer comprises a material selected from the group consisting of silicon nitride, silicon oxide and combinations thereof.

9. The method of claim 8, wherein the interlayer insulating layer and the gate masking layer comprise the same material.

10. The method of claim 7, wherein said step of forming a first impurity region is preceded by the step of forming a protection layer on a face of the semiconductor substrate and on the sidewall of the gate line; wherein the protection layer comprises silicon oxide and the spacer layer comprises silicon nitride; wherein said step of selectively etching the spacer layer comprises selectively etching the spacer layer to expose the protection layer; and wherein the protection layer extending outside the gate line is selectively removed with respect to the spacer layer.

11. The method of claim 7, further comprising the step of forming a conductive plug that is electrically connected to the first impurity region in the cell region.

12. The method of claim 7, wherein said step of selectively etching the spacer layer to form a sidewall spacer on the sidewall of the gate line in the peripheral circuit region and then forming a second impurity region in the peripheral circuit region, using the sidewall spacer as an implant mask, is followed by the step of forming silicide contact regions on the first impurity region in the peripheral circuit region.

13. The method of claim 7, wherein said step of forming an interlayer insulating layer is preceded by the step of forming a nitride stopper on an entire surface of the semiconductor substrate; wherein said step of selectively etching the interlayer insulating layer to define a contact hole therein, using the spacer layer as an etching stopper in the cell region, stops at the nitride stopper; and wherein said step of selectively etching the spacer layer to form a sidewall spacer on the sidewall of the gate line in the cell region, using the interlayer insulating layer as an etching mask, comprises etching the nitride stopper and the spacer layer simultaneously.

14. The method of claim 13, further comprising the steps of:
   forming a conductive plug that is electrically connected to the first impurity region, in the contact hole;
   forming a second interlayer insulating layer on the interlayer insulating layer including the conductive plug; and
   forming contacts to the conductive plug in the cell region and to the gate electrode of the gate line in the peripheral circuit region and to the second impurity region in the peripheral circuit region.

15. The method of claim 14, wherein said step of forming a nitride stopper is preceded by the step of forming silicide contact regions on the second impurity region in the peripheral circuit region; and wherein the contact to the second impurity region in the peripheral circuit region exposes the silicide contact regions in the peripheral circuit region.

16. The method of claim 10, wherein the gate line comprises a composite of a polysilicon layer, a polycide layer on the polysilicon layer, a silicon nitride capping layer on the polycide layer and a silicon oxide capping layer on the silicon nitride capping layer.

17. A method of forming a semiconductor device, comprising the steps of:
   forming a gate line on a semiconductor substrate including cell and peripheral circuit regions, the gate line comprising a composite of a polysilicon layer, a polycide layer on the polysilicon layer, a silicon nitride capping layer on the polycide layer and a silicon oxide capping layer on the silicon nitride capping layer;
   forming an oxide protection layer on the semiconductor substrate including the gate line;
   forming a first impurity region in the cell and peripheral circuit regions of the semiconductor substrate, using the gate line as an implant mask;
   forming a nitride spacer layer at least on a sidewall and upper surface of the gate line;
   selectively etching the spacer layer to form a nitride sidewall spacer on the sidewall of the gate line in the peripheral circuit region and then forming a second impurity region in the peripheral circuit region, using the sidewall spacer as an implant mask;
   forming a silicide contact on the second impurity region in the peripheral circuit region;
   forming a nitride protection layer on an entire surface of the semiconductor substrate;
   forming a first interlayer insulating layer on the nitride protection layer;
   selectively etching the first interlayer insulating layer to define a contact hole therein, using the nitride protection layer and nitride spacer layer as an etch-stop in the cell region;
   selectively etching the nitride protection layer and nitride spacer layer to form a nitride sidewall spacer on the sidewall of the gate line in the cell region, using the first interlayer insulating layer as an etching mask;
   forming a conductive plug that is electrically connected to the first impurity region, in the contact hole in the cell region;
   forming a second interlayer insulating layer on the first interlayer insulating layer including the conductive plug; and
   forming contacts to the conductive plug in the cell region and to the polycide layer of the gate line in the peripheral circuit region and to the suicide contact in the peripheral circuit region.

* * * * *